United States Patent [19]

Granek et al.

[11] 4,403,345
[45] Sep. 6, 1983

[54] DEVICE FOR DETECTING THE TUNING FREQUENCY OF A FREQUENCY MODULATION RADIO RECEIVER

[75] Inventors: Roger Granek; Jean Hybre; Michel Drobecq, all of Paris, France

[73] Assignee: Thomson-CSF, Paris, France

[21] Appl. No.: 302,675

[22] Filed: Sep. 15, 1981

[30] Foreign Application Priority Data

Sep. 16, 1980 [FR] France .................................. 80 019918

[51] Int. Cl.³ ............................................... H04B 1/16
[52] U.S. Cl. .................................... 455/182; 455/183; 455/192; 455/208; 455/263
[58] Field of Search ............... 455/161, 164, 165, 169, 455/182, 183, 192, 195, 208, 67, 226, 256, 257, 258, 263

[56] References Cited

U.S. PATENT DOCUMENTS

| 4,004,231 | 1/1977 | Elshuber et al. ................... 455/192 |
| 4,174,501 | 11/1979 | Chastagnier et al. ............... 455/161 |
| 4,271,530 | 6/1981 | Van Deursen ....................... 455/192 |
| 4,348,772 | 9/1982 | Leland et al. ....................... 455/184 |

*Primary Examiner*—Jin F. Ng

[57] ABSTRACT

A device comprising a demodulator, equipped with a frequency synthesizer for synthesizing different tuning frequencies, for use in radio receivers. The device further comprises a counter for counting the number of "clicks" at the demodulator output, for each tuning frequency. A microprocessor is provided for identifying the tuning frequency for which there is a minimum of "clicks," this being the correct tuning frequency. The microprocessor acts on the synthesizer for tuning the frequency of the synthesizer at the correct tuning frequency.

4 Claims, 2 Drawing Figures

DEVICE FOR DETECTING THE TUNING FREQUENCY OF A FREQUENCY MODULATION RADIO RECEIVER

BACKGROUND OF THE INVENTION

This invention concerns a device for detecting the tuning frequency of a frequency-modulation radio receiver, and more especially a device for detecting the tuning frequency of a frequency-modulation radio receiver which is moving in relation to broadcasting stations transmitting on different frequencies.

Such a device may be used in a radio-link system between a train and fixed stations along the track. There may be three different transmitting frequencies, for example, and two consecutive fixed stations transmitting on different frequencies. When the receiver on the train covers the distance between two stations, it must at a certain moment receive an order to stop receiving the frequency of the station it has left, and to start receiving the frequency of the next station.

In conventional systems of this kind, the receiver comprises different local oscillators, supplying the different tuning frequencies corresponding to transmitting frequencies, and the correct local oscillator is chosen by means of a tuning-frequency detecting or searching device.

This tuning-frequency searching device usually operates on the principle of examining the quality of the demodulated signal.

In a known device of this kind, examining the quality of the demodulated signal is achieved by isolating the noise from the effective signal, then measuring the length of time during which the noise level is above a certain threshhold. If this period exceeds a certain threshhold value, the decision is taken to switch from one local oscillator to another.

This method consequently requires a band-pass filter to select the noise outside the effective signal band, a threshhold detector to select noise which exceeds a certain threshhold level, a clock generator combined with an "AND" gate circuit to measure the duration of the noise selected by the threshhold detector, and a counting system to measure this duration and compare it with the threshhold level.

The present invention concerns a simplified device for detecting a tuning frequency, in which a completely different method is used to examine the quality of the demodulated signal.

The invention makes use of a phenomenon usually regarded as a form of undesirable disturbance, known as "clicks," described in particular in *Time series analysis* by S. O. Rice (ed. M. Rosenblatt, Wiley 1963, pp. 395-422).

These clicks are noise pulses which appear in an asynchronous demodulator, beyond the demodulation threshhold, caused by a sudden squaring of the noise and the effective signal. Their amplitude, while theoretically infinite, is in fact far higher than that of the noise and effective signal, and their number is in inverse proportion to the ratio of signal to noise at medium or average frequency.

The demodulated signal to noise ratio can therefore be found by measuring the frequency of these clicks; the ratio of signal to noise at low frequency can be compared for different frequencies, simply by comparing the frequency of these clicks: the right tuning frequency is the one at which said frequency is lowest.

SUMMARY OF THE INVENTION

According to this invention, the device for detecting the tuning frequency of a frequency-modulation radio receiver which is moving in relation to transmitting stations transmitting at different frequencies, and which contains a demodulator equipped with means of synthesizing different tuning frequencies corresponding to transmitting frequencies, comprises:

means for counting the number of clicks at the demodulator output for each tuning frequency, during a period of T time;

means for identifying the tuning frequency at which the minimum number of clicks occurs, this being the tuning frequency to be detected, said identifying means supplying a signal controlling the means for synthesizing the various tuning frequencies.

According to another feature of the invention, the device for detecting a tuning frequency comprises means for integrating the results supplied by the counting means for each tuning frequency, such means being interposed between the counting means and the tuning frequency identifying means.

According to yet another feature of the invention, the device for detecting a tuning frequency comprises means for activating the counting, integrating and identifying means, at a given frequency f.

BRIEF DESCRIPTION OF THE DRAWINGS

Further advantages and features of the invention will appear from the following description of one possible embodiment, with reference to the accompanying drawings, wherein.

DETAILED DESCRIPTION OF THE PREFERRED EMBODIMENTS OF THE INVENTION

Figure 1:
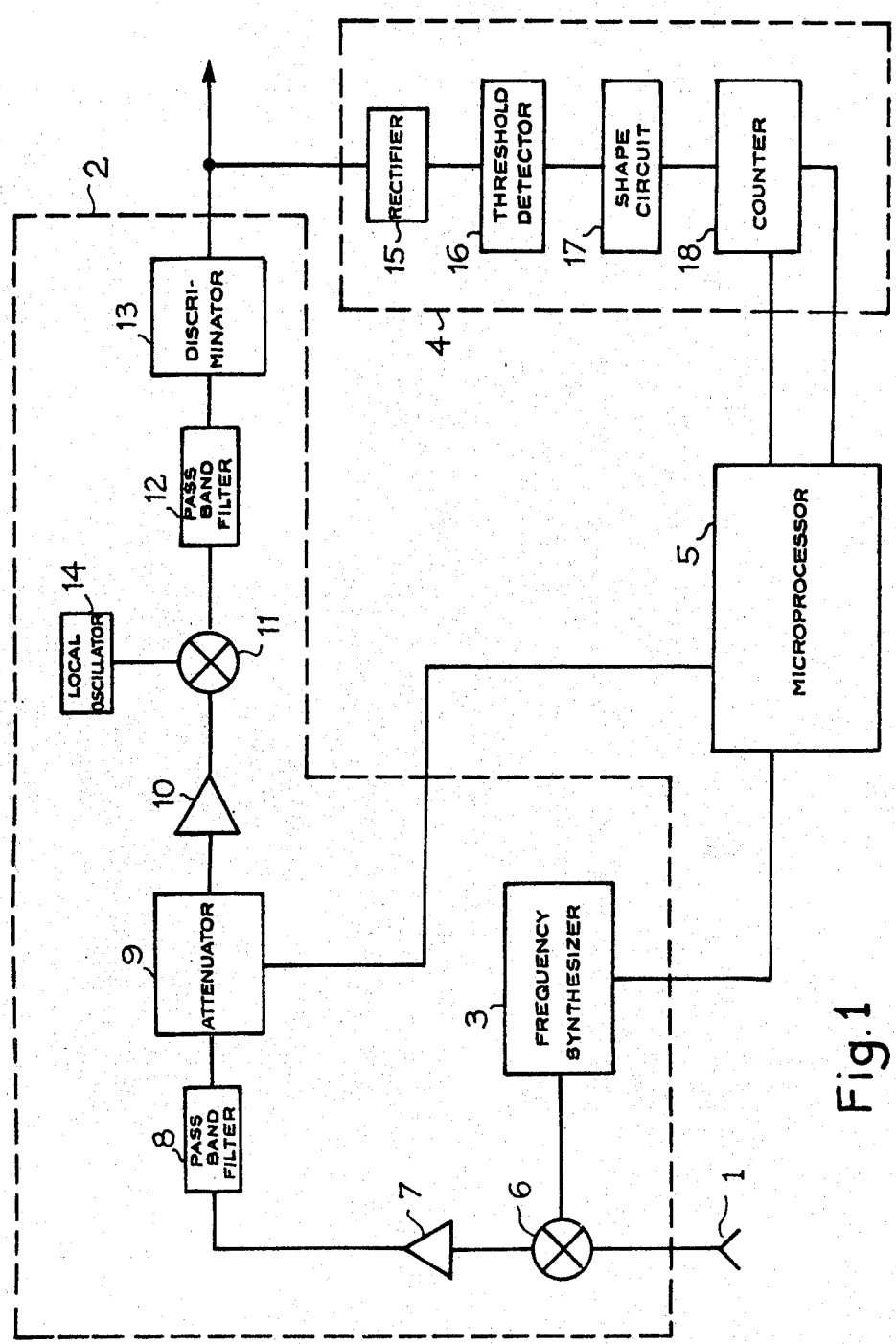
FIG. 1 is a diagram of a radio receiver comprising a device for detecting a tuning frequency according to the invention.

FIG. 1 shows a radio receiver comprising a receiving aerial 1 followed by a demodulator 2 which is equipped with a frequency synthesizer 3, capable of generating various tuning frequencies corresponding to the various transmission frequencies, and a tuning frequency detecting device which comprises means 4 for counting noise pulses connected to the demodulator output, and means 5 for identifying the tuning frequency at which the number of noise pulses is minimum, such means 5 being interposed between the output of the counting means and the synthesizer control input.

Following the aerial, the demodulator 2 comprises a mixer 6 which imposes the first frequency change on the signal received. The signal required for this frequency change is supplied by the frequency synthesizer 3.

This first mixer 6 is followed by an amplifier 7, a pass-band filter 8, an attenuator 9, a second amplifier 10, a second mixer 11, a second pass-band filter 12 and a discriminator 13.

The signal at the discriminator output is the demodulated input signal.

The signal required for the second frequency change, made by the second mixer 11, is supplied by a local oscillator 14. The frequency synthesizer 3 and the attenuator 9 are controlled by the tuning frequency detecting device.

The attenuator raises the noise level in relation to the effective signal level, bringing it into a zone where measurement of the signal to noise ratio is possible, and thereby increasing the measurement dynamic of the device for detecting a tuning frequency.

The device for detecting the tuning frequency comprises means 4 for counting the number of noise pulses at the demodulator output, for each tuning frequency, over a period of time T, and means 5 for identifying tuning frequency at which there is a minimum number of noise pulses; this frequency is the correct tuning frequency.

The counting means comprise a rectifier 15 which receives the demodulator output signal, a threshhold detector 16, which receives the rectifier output signal, a circuit 17 to shape threshhold detector output signals, and a counter 18 which is incremented at the rhythm of the signal supplied by the shaping circuit 17 and controlled by the signal supplied by the identifying means 5. These identifying means 5 consist of a microprocessor, to control and process measurements taken by the counting means 4.

The device for detecting a tuning frequency operates as follows.

The signal reaching the rectifier 15 input consists of the superimpose demodulated effective signal, noise and clicks. In this new device, this signal is used, without any prior treatment, by the detecting device.

Since the detecting device according to the invention is based on using noise pulses and since said pulses may be positive or negative, the demodulator output signal is first rectified by the rectifier 15, so that their subsequent processing will be the same, regardless of the polarity of the noise pulses.

The threshhold detector 16 detects the noise pulses in the signal from the rectifier 15. They can be detected in this way, on the basis of a threshhold criterium, because of the wide difference between the amplitude of such pulses and the amplitude of the remainder of the signal. The threshhold selected for the detector 16 takes this value into account, and is accordingly set fairly high.

The shaping circuit 17 turns the noise pulses detected by the detector 16 into a rectangular form suitable for the counter 18 which counts the number of clicks affecting the demodulated signal.

In the embodiment described here, identifying is done by a microprocessor, which uses the results supplied by the counting means 4, while also integrating the results supplied by the counting system for each tuning frequency.

The microprocessor also activates the counting, integrating and identifying means at frequency f, which it can change, taking into account the results of previous measurements.

Furthermore, the microprocessor resets the counting system at frequency 1/T.

Figure 2:
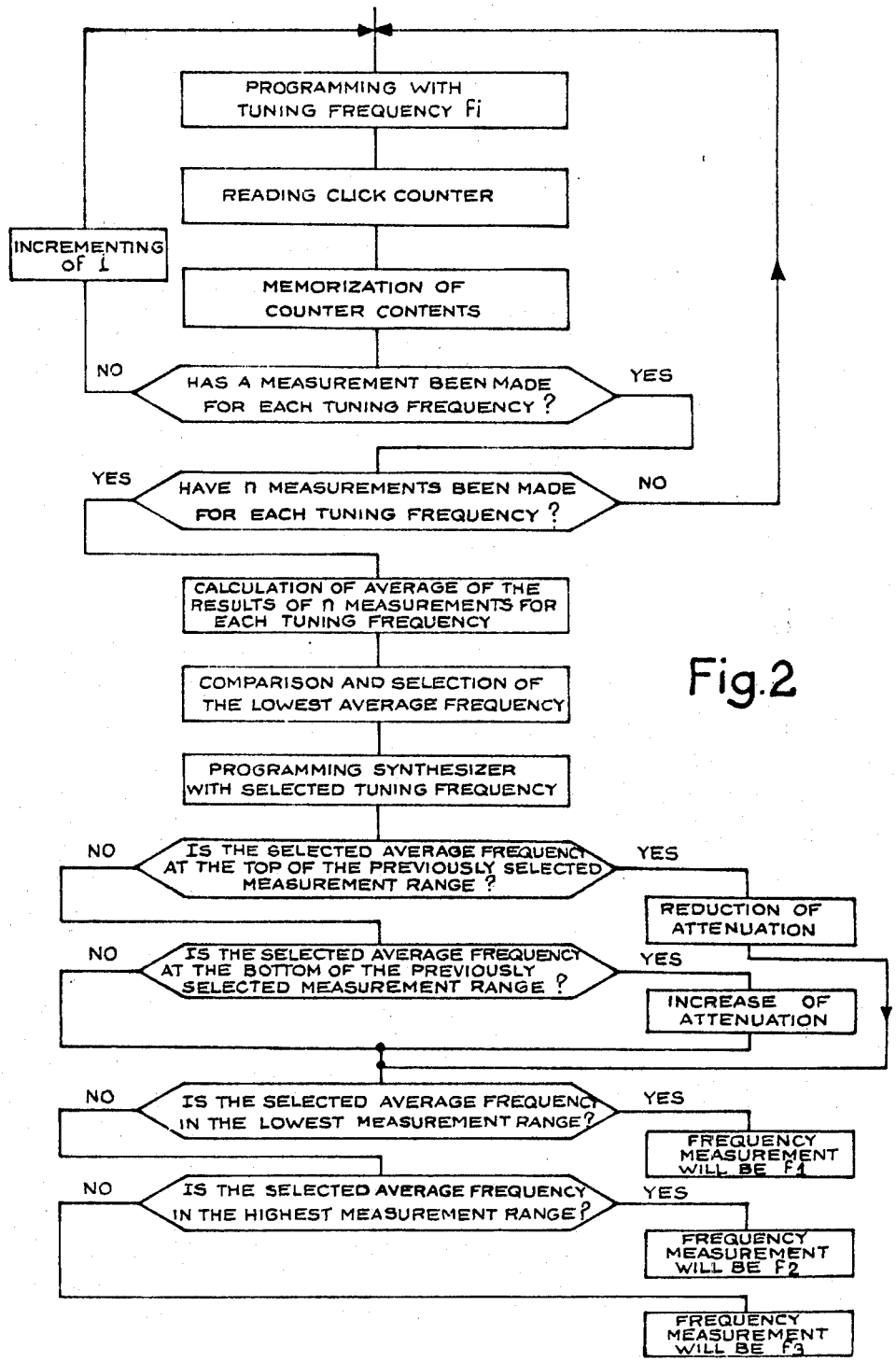
FIG. 2 is an algorithm representing the sequence of data-processing stages performed by a tuning frequency detecting device according to the invention.

FIG. 2 shows the algorithm used to programme the microprocessor. Said algorithm begins with programming of the frequency synthesizer 3 with one of the possible tuning frequencies $f_i$. For this frequency, the microprocessor enables the counter to count for a period of time T, at the end of which it memorizes the contents of said counter 18.

The same process is then repeated for tuning frequency $f_{i+1}$ and so on for all frequencies.

The same process is repeated n times for all tuning frequencies, in order to ensure integration of results obtained for each such frequency.

The microprocessor then computes the average of the results obtained for the n measurements relating to each tuning frequency, and compares these different average frequencies, to select the weakest, since this corresponds to the frequency with the minimum average frequency of noise pulses or clicks, in other words the correct tuning frequency. The frequency synthesizer 3 is then programmed with the selected tuning frequency.

The microprocessor then proceeds to determine measuring conditions for subsequent measurements, namely the frequency of subsequent measurements, and the attenuation produced by the attenuator 9.

To this effect, the microprocessor performs a number of tests on the selected average frequency.

A first test consists in locating the selected average frequency within a measurement range comprising all average click frequencies between a lower limit and an upper limit.

A second test consists in locating the selected measurement range within a set of measurement ranges juxtaposed in such a way as to cover a frequency zone which varies in extent depending on the selected number of ranges.

The purpose of the first test is to determine the attenuation required from the attenuator 9 during subsequent measurements.

The purpose of the second test is to determine the frequency of subsequent measurements.

The measurement range within which subsequent measurements are to be made can be determined on the basis of these two variables, attenuation and measurement frequency.

During the first test, the selected average frequency is compared with the upper and lower limits of the previously selected measurement range. If it is close to the upper limit of the previously selected measurement range, the decision is taken to reduce the attenuation produced by the attenuator for subsequent measurements, while if it is close to the lower limit, the decision is taken to increase attenuation.

During the second test, the microprocessor determines whether the selected average frequency is within the lower measurement range, by which is meant the range in which the average click frequency values are highest.

If this is the case, the decision is taken that the frequency for subsequent measurements will be the highest frequency, i.e. $f_1$. If the selected average click frequency is too high, this means that the receiver is in a transition zone between different transmitting frequencies, and that measurements need to be repeated more quickly, to find the tuning frequency matching the new transmitting frequency as soon as possible.

If this is not the case, the device finds whether the selected average frequency lies within the highest measurement range, by which is meant the range in which average click frequency values are lowest.

If the selected average frequency lies within the highest measurement range, the decision is taken that the frequency for subsequent measurements will be the lowest frequency, i.e. $f_3$. If the selected average click (or noise pulse) frequency is very low, this means that the receiver is in a zone where interference from other transmitting frequencies is not yet apparent, and where it is consequently unnecessary to repeat measurements frequently.

If the selected average frequency lies neither in the lowest nor the highest measurement range, the decision is taken that the frequency for subsequent measurements will be $f_2$, comprised between $f_1$ and $f_3$.

This algorithm is thus repeated at the selected measurement frequency.

The possibility of varying the rate of attenuation of the measured signal and the measurement frequency provides a significant improvement in the quality and timing of measurements.

What is claimed is:

1. A device for detecting the tuning frequency of a frequency-modulation radio receiver which is moving in relation to transmitting stations transmitting at different frequencies, comprising: a demodulator equipped with means for synthesizing different tuning frequencies corresponding to the different transmitting frequencies, said device further comprising counting means for counting the number of noise pulses at the demodulator output, for each tuning frequency over a period of time T, and identifying means connected to said counting means for identifying the tuning frequency at which there is the minimum number of such noise pulses, this being the correct tuning frequency, said identifying means supplying a control signal for tuning said means for synthesizing the different tuning frequencies at the correct tuning frequency.

2. A device as defined in claim 1, in which the counting means comprise a rectifier connected to the demodulator output, a threshhold detector connected to the rectifier output, a shaping circuit connected to the threshhold detector output, and a counter, incremented by the shaping circuit output signal, and reset by a clock signal of frequency $1/T$.

3. A device as defined in claim 2, in which the frequency $1/T$ of the clock signal varies depending on the results supplied by said identifying means.

4. A device as defined in claim 2, in which the demodulator comprises an attenuator capable of raising the noise level in relation to the effective signal level, and which comprises means for controlling the attenuator on the basis of results supplied by the identifying means.

* * * * *